United States Patent [19]

Kondo et al.

[11] Patent Number: 4,935,267
[45] Date of Patent: Jun. 19, 1990

[54] PROCESS FOR ELECTROLESSLY PLATING COPPER AND PLATING SOLUTION THEREFOR

[75] Inventors: Koji Kondo, Chiryu; Katuhiko Murakawa, Obu; Nobumasa Ishida, Chiryu; Junji Ishikawa, Nagoya; Kaoru Nomoto, Okazaki; Futoshi Ishikawa, Nagoya, all of Japan

[73] Assignee: Nippondenso Co., Ltd., Kariya, Japan

[21] Appl. No.: 190,854

[22] Filed: May 6, 1988

[30] Foreign Application Priority Data

May 8, 1987 [JP] Japan .................. 62-110724
Jun. 19, 1987 [JP] Japan .................. 62-154138
Aug. 26, 1987 [JP] Japan .................. 62-212577

[51] Int. Cl.$^5$ ............................ B05D 1/18
[52] U.S. Cl. ................... 427/443.1; 427/305; 427/98
[58] Field of Search ............ 427/443.1, 305, 98

[56] References Cited

U.S. PATENT DOCUMENTS

| | | | |
|---|---|---|---|
| 3,645,749 | 2/1972 | Paunovic | 427/443.1 |
| 3,650,777 | 3/1972 | Schneble | 427/443.1 |
| 4,066,809 | 1/1978 | Alpaugh | 427/305 |
| 4,169,171 | 9/1979 | Narcus | 427/443.1 |
| 4,265,943 | 5/1981 | Goldstein et al. | 427/8 |
| 4,301,196 | 11/1981 | McCormack et al. | 427/305 |
| 4,391,841 | 7/1983 | Zeblisky | 427/443.1 |
| 4,525,390 | 1/1985 | Alpaugh et al. | 427/305 |
| 4,650,691 | 3/1987 | Kinoshita et al. | 427/305 |
| 4,834,796 | 5/1989 | Kondo | 427/305 |

Primary Examiner—Shrive Beck
Assistant Examiner—Vi Duong Dang
Attorney, Agent, or Firm—Cushman, Darby & Cushman

[57] ABSTRACT

By forming a first copper layer on a substrate by using a complexing agent for copper ion, which has a low copper complex stability constant, a uniform second layer can be stably formed by a second complexing agent for a copper ion, which has a high copper complex stability constant, even if the substrate is composed of a material having a low catalytic activity, such as tungsten, or even if the catalytic activity of the substrate is uneven. A similar effect can also be obtained by adding a small amount of a complexing agent for a copper ion, having a low stability constant, to an electroless copper plating bath containing a complexing agent for a copper ion, having a low stability constant. In this case, an effect of preventing stopping of the reaction of the complexing agent of a copper ion, having a high stability constant, is attained. Most preferably, after formation of a uniform first copper layer by an electroless copper plating solution containing a complexing agent for a copper ion, having a low stability constant, a second copper layer is formed by an electroless copper plating solution containing a complexing agent for a copper ion, having a high stability constant and also in this case, a small amount of a complexing agent for a copper ion, having a low stability constant, is added.

17 Claims, 9 Drawing Sheets

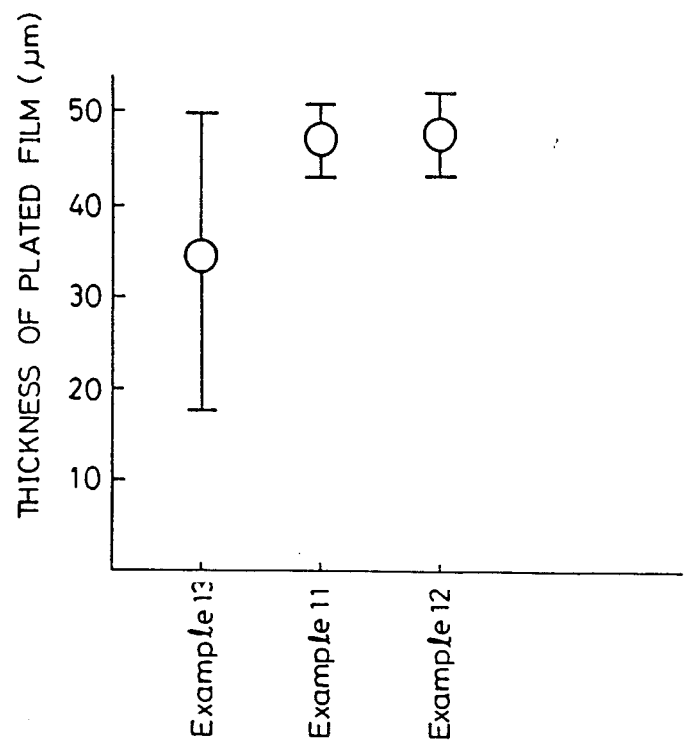

PROCESS FOR ELECTROLESSLY PLATING COPPER AND PLATING SOLUTION THEREFOR

BACKGROUND OF THE INVENTION (1) Field of the Invention

The present invention relates to a process for an electroless plating of copper for forming a copper film, for example, of a conductor circuit on a printed circuit board or a ceramic substrate, and a plating solution for use in carrying out this plating process.

(2) Description of the Related Art

As the electroless copper plating solution for chemically depositing metallic copper, there have ordinarily been used solutions containing ethylenediamine-tetraacetic acid (EDTA) or Rochelle salt as a complexing agent for a copper ion, copper sulfate as a copper salt, formalin or formaldehyde as a reducing agent and caustic soda as a pH-adjusting agent. However, these electroless copper plating solutions do not sufficiently spread because the copper-deposition speed is extremely low, several $\mu m$ per hour, and the physical properties are insufficient.

Under this background, the present inventors previously developed and disclosed an electroless copper plating solution providing a copper film having excellent physical properties at a high deposition speed (at least 30 $\mu m/hr$, especially at least 100 $\mu m/hr$) by using a trialkanolamine, which is a highly stable complexing agent for a copper complex, as a complexing agent and accelerator (U.S. Pat. Application Ser. No. 117,079 filed on Nov. 5, 1987 now U.S. Pat. No. 4,834,796.

However, it was found that if plating is carried out by using this electroless copper plating solution, a new problem arises in that a uniform copper layer is not formed or a copper layer is not formed at all because of the effects of a catalytic activity at the surface of a substrate.

The present inventors investigated the causes of this problem, with the following facts found.

Namely, an electroless copper plating solution containing, as a complexing agent, triethanolamine having a high copper ion complex stability constant (also called "complex-forming constant") reacts selectively with a portion of the surface of a substratehaving a high catalytic activity. Accordingly, if a palladium layer is formed as s catalyst on the surface of a resin substrate, since it is generally difficult to form the palladium layer uniformly on the surface of the substrate and a large dispersion of the catalytic activity is produced on the surface of the substrate, it is impossible to form a uniform copper layer on the surface of the substrate.

On the other hand, where it is intended to perform an electroless plating of copper on a molybdenum or tungsten layer formed as a conductor pattern on the surface of a ceramic substrate such as alumina, since the catalytic activity of molybdenum or tungsten is much lower than that of palladium, it is impossible to deposit a copper layer by using the above-mentioned electroless copper plating solution containing triethanolamine.

As apparent from the foregoing description, in case of an electroless copper plating solution containing a complexing agent having a high stability constant as a copper complex, such as triethanolamine, a uniform copper layer is not formed or a copper layer is not formed at all because of the effects of the catalytic activity at the surface of a substrate due to a high catalytic selectivity of the plating solution.

It is therefore a primary object of the present invention to provide an electroless plating process in which a uniform copper layer can be formed even when a dispersion of the catalytic activity on the surface of a substrate ocurrs, and a copper layer can be formed even if the catalytic activity at the surface of a substrate is low.

Furthermore, where plating is carried out by using the above-mentioned electroless copper plating solution proposed by the present inventors, if maintenance of the plating solution is not properly carried out, the problem a stopping of the plating reaction arises, entirely or partially on the substrate surface before a desired plating thickness is obtained. The same problems arises when the above-mentioned conventional electroless copper plating solutions are used.

The cause of the stopping of the plating reaction has not been fully clarified. The phenomenon commonly observed in all plating solutions is that if the plating reaction is stopped, a passive state film is formed and even if this film is removed by an acid treatment to expose a fresh plated surface (Cu surface), reaction can rarely be restarted. Namely, it is considered that the generation of this passive state is not due to a deterioration of the plating solution but to a reduction of the catalytic activity of the plated surface.

As means for eliminating this trouble, there are known two methods; that is, a method in which a generation of the passive state is prevented by reducing the adsorbing capacity of the additive (Japanese Unexamined Patent Publication No. 60-70183) and a method in which plating is first conducted for a short time, a catalytic metal having a high activity, such as Pd, is adsorbed again and plating is then conducted for a long time (Japanese Unexamined Patent Publication No. 57-192099). However, use of an additive having a reduced adsorbing capacity according to the former method will naturally have an adverse effect on the plating characteristics, and in the latter method in which Pd or the like is adsorbed midway in the plating operation, it is apprehended that the Pd will adhere to a portion where plating is not desired as a product, and a problem of a formation of a short circuit in a formed circuit will arise.

Therefore, another object of the present invention is to provide an electroless copper plating process in which even if the catalytic activity is reduced by an improper maintenance of the plating solution or the like, electroless copper plating can be stably performed on the surface to be plated at a high speed.

SUMMARY OF THE INVENTION

The foregoing objects of the present invention can be attained by a process for electrolessly plating copper on a substrate, comprising the steps of i) immersing a substrate having a surface in a first electroless copper plating bath containing a copper ion, a first complexing agent for the copper ion, a reducing agent and a pH-adjusting agent to form a first copper film on the surface of the substrate; and ii) immersing the substrate in a second electroless copper plating bath containing a copper ion, a second complexing agent for the copper ion, a reducing agent and a pH-adjusting agent to form a second copper film on the first copper film; wherein the first complexing agent for the copper ion has a copper complex stability constant substantially lower than that of the second complexing agent for the copper ion.

In brief, according to this process, in order to cause reaction stably on a substrate surface having a low catalytic activity, a uniform copper plating layer is first formed by a complexing agent for a copper ion (first complexing agent for a copper ion) having a low stability constant as the copper ion complex. The stability constant of a complexing agent for a complexing ion as s copper ion complex, referred to herein, is a logarithm of the equilibrium constant of $Cu^{2+} + L \rightleftharpoons Cu^{2+}-L$ (L stands for a ligand, that is, the complexing agent for the complexing ion). The larger this value, the more stable presence of the complex $Cu^{2+}-L$.

Stability constants of typical complexing agents for a copper ion are shown in the following Table.

TABLE

| Complexing Agent | Stability Constant |
| --- | --- |
| Rochelle salt | 15.0 |
| Ethylenediamine-tetraacetic acid (EDTA) | 18.0 |
| Triethanolamine (TEA) | 20.7 |
| Nitrilotriacetic acid (NTA) | 12.96 |
| Diethylenetriamine-pentaacetic acid (DTPA) | 21.05 |

Note

From the viewpoint of reaction stability, it is construed that the stability constant of N,N,N',N'-tetrakis(2-hydroxypropyl)ethylenediamine (HPA: Quadrol) is lower than that of ethylenediamine-tetraacetic acid.

In this process, a complexing agent having a stability constant lower than that of ethylenediamine-tetraacetic acid is preferred as the first complexing agent for the copper ion in the first electroless copper plating solution. For example, at least one member selected from the group consisting of ethylenediamine-tetetraacetic acid, N,N,N',N'-tetrakis(2-hydroxypropyl)ethylenediamine, nitrilotriacetic acid and Rochelle salt is used.

The first complexing agent for the copper ion in the first electroless copper plating solution has a low stability constant as the copper ion complex. Since the electroless copper plating solution containing this first complexing agent for the copper ion, which has a low stability constant, has a low catalytic selectivity, plating reaction advances without being substantially influenced by the catalytic activity of the substrate surface, and copper is precipitated. Furthermore, the electroless copper plating solution containing the first complexing agent for the copper ion, which has a low stability constant, has a low copper-precipitating speed and the growth of the copper layer in the thickness direction is slow, and therefore, so substantial difference of the thickness of the precipitated copper layer is brought about according to the degree of the above-mentioned catalytic activity, and the substrate surface is entirely covered with a copper layer.

Accordingly, by forming a copper layer on the substrate surface by a first electroless copper plating solution containing a first complexing agent for a copper ion, which has a low stability constant, the surface activity of the substrate surface can be uniformalized.

According to this process, the subsequent plating operation is carried out after the surface activity of the substrate surface is thus uniformalized.

The second electroless plating solution used at this plating step contains a second complexing agent for the copper ion, which has a substantially higher stability constant as the copper complex than that of the first complexing agent for the copper ion. However, the effect of the present invention is especially prominent when the stability of the copper ion complex of the second complexing agent for the copper is high and the stability constant is higher than that of ethylenediamine-tetraacetic acid (EDTA), that is, when EDTA, TEA or DTPA, or especially a trialkanolamine capable of realizing a high-speed electroless copper plating, is used as the second complexing agent for the copper ion.

Where the trialkanolamine is used as the second complexing agent for the copper ion, it is preferred that the second complexing agent for the copper be used at an equivalent ratio of at least 1.2, especially 1.3 to 20, to the copper ion in the second electroless copper plating solution. If the trialkanolamine is used in an excessive amount to the copper ion, the trialkanolamine acts not only as a complexing agent but also as an accelerator, and a high-speed electroless copper plating becomes possible. As the trialkanolamine, there can be mentioned triethanolamine (TEA) and triisopropanolamine.

In this process, when plating is carried out by using an electroless copper plating solution containing a second complexing agent for the copper ion, which has a higher stability constant as the copper ion complex than that of the first complexing agent for the copper ion, since a copper layer having a substantially uniform thickness is formed in advance on the substrate surface by the first electroless copper plating solution containing the first complexing agent for the copper ion as pointed out hereinbefore, a high catalytic selectivity of the second electroless plating solution containing this second complexing agent for the copper ion is advantageously exerted, and a second copper layer is precipitated at an equal precipitation speed at any part of the first copper layer. Accordingly, a copper layer is uniformly formed on the substrate surface and the thickness is substantially uniform.

In accordance with one aspect of the present invention, it is preferred that the second electroless copper plating solution should contain a small amount of a third complexing agent for the copper ion, which has a low stability constant, in addition to the second complexing agent for the copper ion, which has a high stability constant as the copper ion complex.

As disclosed hereinbefore, if a trialkanolamine, for example, triethanolamine, is used in an excessive amount as the complexing agent to allow it to act not only as the complexing agent but also as the accelerator, plating reaction can be performed at a very high speed. However, there are indefinite points concerning the catalytic action, and when an additive for improving the physical properties or a surface active agent is incorporated, it sometimes happens that reaction suddenly stops. As disclosed hereinbefore, in order to initiate reaction of triethanolamine, it is necessary that such conditions as the amount of triethanolamine to $Cu^{2+}$, the pH, the $Cu^{2+}$ concentration, the reducing agent concentration, and the $O_2$ concentration should be appropriately controlled. However, it is apprehended that it sometimes happens that these conditions are not satisfied in a partial reaction area on the surface because of erroneous maintenance of the plating solution or the like. In this case, a side reaction other than the plating solution takes place, and as the result, a passive state film is formed which stops the plating reaction. Accordingly, it is construed that the main cause of the stopping of the reaction is a low reactivity of the complex ion, that is, a high stability constant. If a complexing agent having a lower stability constant than that of triethanolamine, for example, the EDTA shown in the Table given hereinbefore, the catalyst selectivity of the surface to be plated is reduced and the plating conditions are considerably broadened. Therefore, if an excessive amount of TEA is added and a small amount of, for example, EDTA is further added, an EDTA-$Cu^{2+}$ complex ion having a low stability is present not only when the high-speed reaction by TEA is advanced but also when conditions not allowing an advance of the high-speed reaction are temporarily produced, and therefore, the copper-precipitating reaction is continued and the reaction is not stopped. As a result, the high-speed reaction conditions are restored and a high-speed reaction is conducted.

A complexing agent similar to the above-mentioned complexing agent for the copper ion can be used as the third complexing agent for the copper ion. Accordingly, EDTA, HPA, NTA and Rochelle salt are preferably used. It is preferred that the third complexing agent for the copper ion be used at an equivalent ratio of 1/100 to ½, especially 1/50 to ½, to the copper ion. If the amount of the second complexing agent for the copper ion is insufficient, the effect of preventing stopping of the plating reaction is not sufficient, and if the amount of the third complexing agent for the copper ion is too large, an abnormal precipitation on an undesired part of the substrate surface or a decomposition of the plating solution is caused.

If this electroless copper plating solution containing not only the main complexing agent for the copper ion, which has a high stability constant as the copper ion complex but also a small amount of the complexing agent for the copper ion, which has a substantially lower stability constant as the copper ion complex than that of the main complexing agent, even if a copper film is not formed in advance by using a complexing agent for the copper ion, which has a lower stability constant, in another plating solution, a copper film can be stably formed on tungsten or molybdenum on the substrate by the complexing agent for the copper ion, which has a high stability constant. More specifically, on tungsten or molybdenum having a low catalyst activity, the copper complex ion of the complexing agent for the copper ion, which has a low stability constant, reacts with the reducing agent to form a thin copper film on tungsten or the like, whereby the surface of tungsten or the like having a low activity is converted to a copper surface having a high activity. Then, the high-stability copper complex ion having a high reactivity reacts with the reducing agent on the copper surface having a high catalytic activity and high-speed plating reaction is advanced. Namely, the lowly stable complexing agent for the copper ion acts as a triggering agent (initiator) of the reaction, and if this complexing agent is added in an amount exceeding a certain level, the intended effect can be attained.

In this electroless copper plating solution, the low stability complexing agent exerts the function of eliminating the risk of stopping of the reaction once initiated by the high stability complexing agent at the midway point there of, as pointed out hereinbefore.

Therefore, in accordance with another aspect of the present invention, there is provided an electroless copper plating process, which comprises forming a copper plating film on the surface of a substrate by immersing the substrate in an electroless copper plating bath containing a copper ion, a complexing agent for the copper ion, a reducing agent and a pH-adjusting agent, wherein the complexing agent for the copper ion comprises a first complexing agent for the copper ion and a second complexing agent for the copper ion, the second complexing agent for the copper ion is present in an amount sufficient to substantially complex the copper ion present in the bath, the copper complex stability constant of the first complexing agent for the copper ion is substantially lower than that of the second complexing agent for the copper ion, and the first complexing agent for the copper ion is present in an amount of 1/000 to ½ equivalent to the copper ion.

A realization of a preferential initiation of the reaction by the use of the low stability complexing agent for the copper ion results in an improvement of the pH dependency. Namely, in case of the ethanolamine bath, the critical pH value for initiation of the reaction is about 12.5, but if EDTA or HPA (Quadrol) is used, a high-speed reaction is stably initiated even at a pH lower than 12.5. It is constructed that this is due to the fact that the complex ion of the low stability complexing agent for the copper ion (EDTA, HPA or the like) reacts first to precipitate copper and improve the catalytic activity of the surface to be plated and therefore, a high-speed plating reaction is smoothly initiated. By virtue of this effect, control and maintenance of the plating bath can be facilitated according to the present invention.

Therefore, in accordance with still another aspect of the present invention, there is provided an electroless copper plating solution containing a copper ion, a complexing agent for the copper ion, a reducing agent and a pH-adjusting agent, wherein the complexing agent for the copper ion comprises a first complexing agent for the copper ion and a second complexing agent for the copper ion, the second complexing agent for the copper ion is present in an amount sufficient to substantially complex the copper ion present in the solution, the iron complex stability constant of the first complexing agent for the copper ion is substantially lower than that of the second complexing agent for the copper ion, and the first complexing agent for the copper ion is present in an amount of 1/100 to ½ equivalent to the copper ion. This electroless copper plating solution can be used as the plating solution of the second electroless plating bath in the plating process using the first and second electroless copper plating baths and also as the plating solution in the plating process using the single electroless copper plating bath.

In the present invention, the stability constant of the low stability complexing agent for the copper ion should be substantially lower than that of the highly stable complexing agent for the copper ion, and it is preferred that the difference of the stability constant defined hereinbefore be at least about 1, especially at least about 2. Selection of the low stability complexing agent for the copper ion depends on the kind of the material to be plated, the kind of the highly stable complexing agent for the copper ion, especially the value of the stability constant and the like.

In the process of the present invention, the formation of the first copper layer on the substrate surface by using the first electroless plating bath containing the complexing agent for the copper ion, which has a low stability constant, is accomplished according to the conventional plating treatment, and it is sufficient if a uniform copper layer is formed on the substrate surface.

Any copper salt capable of providing a copper ion can be used without limitation in the present invention. For example, there can be mentioned copper sulfate ($CuSO_4$), copper chloride ($CuCl_2$), copper nitrate [$Cu(NO_3)_2$], copper hydroxide [$Cu(OH)_2$] and copper oxide (CuO). In case of the high-speed bath, the amount of the copper ion present in the bath is 0.005M to 0.1'M, preferably 0.01M to 0.07M. In order to obtain a higher speed than in the conventional baths, the amount of at least 0.005M is necessary, though the value varies to some extent according to the bath conditions, and in view of the stability and from the economical viewpoint, it is preferred that the amount of the copper ion be not higher than 0.1M.

Any substance capable of reducing the copper ion to metallic copper can be used as the reducing agent without any limitation. For example, formaldehyde and derivatives thereof, polymers such as paraformaldehyde, and derivatives and precursors thereof are preferably used. In case of the high-speed bath, the amount of the reducing agent is at least 0.05M, preferably 0.5M to 0.3M, as calculated as the amount of formaldehyde. In order to obtain a higher speed than in the conventional bath, it is necessary that the amount of the reducing agent should be at least 0.05M, and in view of the stability of the bath and from the economical viewpoint, it is preferred that the amount of the reducing agent be not higher than 0.3M.

Any substance capable of adjusting the pH value can be used as the pH-adjusting agent without limitation. For example, there can be mentioned NaOH, KOH, HCl, $H_2SO_4$ and HF. In case of the high-speed bath, the pH value of the bath is ordinarily 12.0 to 13.4 (25° C.) and preferably 12.1 to 13.0 (25° C.).

Incidentally, the electroless plating solution of the present invention can contain a stabilizer and other customarily used additives in addition to the above-mentioned components. The stabilizer for stabilizing the bath and the additive for improving the physical properties of the film are not particularly critical. For example, potassium ferrocyanide, 2,2'-bipyridine and polyethylene glycol can be used.

The electroless copper plating treatment of the present invention may be carried out at any stage as in the conventional technique. In general, a substrate such as glass-epoxy, paper-phenol or ceramics is subjected to a preliminary treatment (washing and chemical surface-roughening) and is then catalyzed (ordinarily, palladium is applied) to impart a sensitivity for a deposition of copper, and then, the substrate is immersed in the plating bath and plating is carried out.

According to the present invention, a high-speed plating becomes possible even on a surface to be plated, which has a low catalytic activity, such as tungsten or molybdenum, though this high-speed plating is very difficult in case of the high-speed triethanolamine bath. Tungsten or molybdenum used for metallization of a ceramic substrate or a ceramic package can be applied by a thin film-forming method such as vacuum deposition, spattering or CVD or a thick film-forming method comprising printing and sintering of a metal paste.

The temperature of the high-speed electroless copper plating bath is preferably in the range of from room temperature to 80° C., especially preferably in the range of from room temperature to 70° C. Plating can be performed at a sufficiently high speed even at room temperature (30° C. or lower), and if the temperature exceeds 80° C., the stability of the plating bath is degraded.

In case of the triethanolamine bath, the copper deposition speed varies greatly according to the oxygen concentration in the bath, and it is necessary that the concentration of dissolved oxygen should be in the range of from 0.5 to 5.4 ppm, preferably in the range of from 1.5 to 4.0 ppm. If the $O_2$ concentration is low, the speed is reduced and the stability is lowered. Accordingly, the oxygen concentration should be at least 0.5 ppm, preferably at least 1.5 ppm. The upper limit of the oxygen concentration is determined by the necessity for an $O_2$ bomb and for economical reasons.

BRIEF DESCRIPTION OF THE DRAWINGS

FIG. 7 shows the plating thickness in the examples;

EXAMPLES

Referential Example 1 (triethanolamine high-speed plating bath)

A stainless steel sheet of 3 cm×7 cm (area=about 40 $cm^2$) was washed by degreasing or the like and treated with a Pd catalyst liquid, for example, Cataposit 44 supplied by Shipley Co. Then, the sheet was washed with water and activated by Accelerator 19 supplied by Shipley Co. The preliminarily treated stainless steel sheet was plated for 2 minutes by an EDTA bath shown in Table 3 to form a copper foil having a thickness of 0.1 to 0.2 μm. The plated sheet was washed with water and plated for 10 minutes in 500 cc of a triethanolamine plating bath prepared in advance. The thickness of the precipitated film was measured by an electrolytic film thickness meter and the measured value was converted to an hourly deposition speed. Incidentally, the plating load was 80 $cm^2/l$. Incidentally, NaOH was used for adjustment of the pH value.

TABLE 1

| Copper Foil-Forming Plating Bath for Obtaining Data | |
|---|---|
| Component | Concentration |
| $CuCl_2$ | 0.06 M |

TABLE 1-continued

| Copper Foil-Forming Plating Bath for Obtaining Data | |
|---|---|
| Component | Concentration |
| EDTA | 0.08 M |
| formalin | 18 ml/l |
| pH (25° C.) | 12.5 |
| Bath temperature | 50° C. |

Incidentally, the plating bath was constantly air-stirred by blowing air, and mechanical stirring was not conducted at all. By the air stirring, the oxygen concentration was adjusted to 1.5 to 4 ppm. Since this placing bath was greatly influenced by the $O_2$ concentration, air bubbling was constantly carried out.

Figure 1:
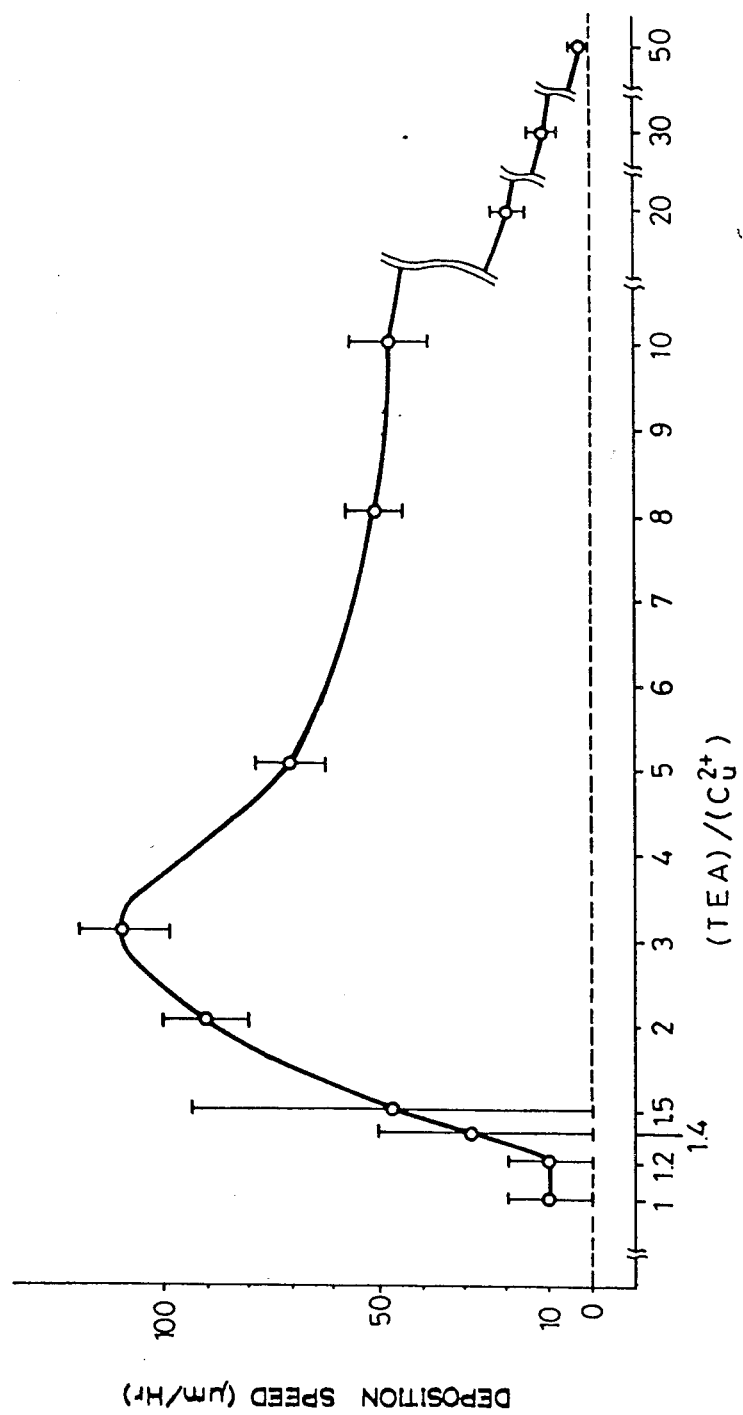
FIG. 1 shows a deposition speed of a copper layer by addition of triethanolamine (TEA)

The prepared triethanolamine (TEA) bath had the composition described below, and a change of the deposition speed was examined by changing the TEA concentration. The obtained results are shown in FIG. 1.

| | |
|---|---|
| $CuCl_2$ | 0.06 M |
| formalin* | 18 ml/l |
| TEA | |
| potassium ferrocyanide | 20 mg/l |
| 2,2-bipyridyl | 10 mg/l |
| pH (25° C.) | 12.8 |
| bath temperature | 60° C. |

Note
Formalin* is a 37% aqueous solution of formaldehyde.

Note

Formalin* is a 37% aqueous solution of formaldehyde.

It is shown that high-speed plating is possible when triethanolamine is added in an amount of at least 1.2 equivalents to the copper ion.

Referential Example 2 (reactivity of bath with substrates)

Since triethanolamine has a high stability constant of the copper complex, initiation of the reaction is generally difficult, especially at a part having a low catalytic activity. From the results of the deposition speed relatively to the triethanolamine/$Cu^{2+}$ ratio, shown in FIG. 1, it is seen that if the amount of triethanolamine is small, that is, if the ratio r of [TEA]/[$Cu^{2+}$] is lower than 1.2, the reaction is hardly initiated. If the reaction is initiated at a ratio r of about 1.5, the speed is very high and the deposition speed is higher than 100 μm/hr, but it sometimes happens that the reaction is not initiated at all.

Initiation of the reaction is influenced by various bath conditions, and as a result of investigations, it was found that initiation of the reaction depends greatly on the conditions of the surface to be plated, that is, the catalytic activity and the surface state. For example, in general, a stainless steel sheet is plated by an EDTA bath but is not plated by a triethanolamine bath. In case of a Pd-applied stainless steel sheet, there is a dispersion of the activity and a difference is brought about by the kind of the catalyst liquid. However, if a glass-epoxy substrate is etched and Pd is applied thereto by a catalyst liquid, the reaction is sufficiently advanced. These results are collectively shown in Table 2. The triethanolamine bath used was the same as the bath described in Referential Example 1.

TABLE 2

| Empirical Reactivity of Bath with Substrates | | | | |
|---|---|---|---|---|
| | Reactivity (whether or not reaction is initiated) | | | |
| Substrate (catalyst) | TEA Bath | EDTA Bath | (TEA + EDTA) Bath | TEA Bath + EDTA Bath |
| stainless steel sheet | x | ○ | x | ○ |
| stainless steel sheet + catalyzation with Pd | Δ | ⊚ | ○ | ⊚ |
| glass-epoxy sheet + catalyzation with Pd | ⊚ | ⊚ | ○ | ⊚ |
| stainless steel sheet + copper foil | ○ | ⊚ | ⊚ | ⊚ |

Note
x: hardly reacted
Δ: difference brought about by catalyst solution
○: almost reacted
⊚: sufficiently reacted Example 1

An ABS type adhesive-applied glass-epoxy substrate (for a printed circuit board) having a size of 7 cm ×3 cm was chemically surface-roughened by a mixed acid of chromic acid and sulfuric acid and treated with a Pd catalyst solution (Cataposit 44 supplied by Shipley Co.), and the substrate was washed with water and activated by Accelerator 19 supplied by Shipley Co. The obtained test piece was used as the material to be plated.

In an electroless copper plating bath formed by adding EDTA, HPA, TIPA, NTA or Rochelle salt as the low stability complexing agent for a copper ion at a predetermined concentration to a basic bath shown below, 10 test pieces of the substrate were plated for 30 minutes, and the number of the test pieces where the reaction was stopped was examined.

| | |
|---|---|
| Copper salt, $CuCl_2$ | 0.06 mole/l |
| Highly stable complexing agent, triethanolamine | 0.3 mole/l |
| Reducing agent, formalin | 10 ml/l |
| Additive, potassium ferrocyanide | 20 mg/l |
| Additive, bipyridyl | 10 mg/l |
| Anionic surface active agent, PC-95 supplied by 3M Co. | 10 mg/l |
| pH (25° C.) | 12.7 |
| Bath temperature | 60° C. |

Figure 2:
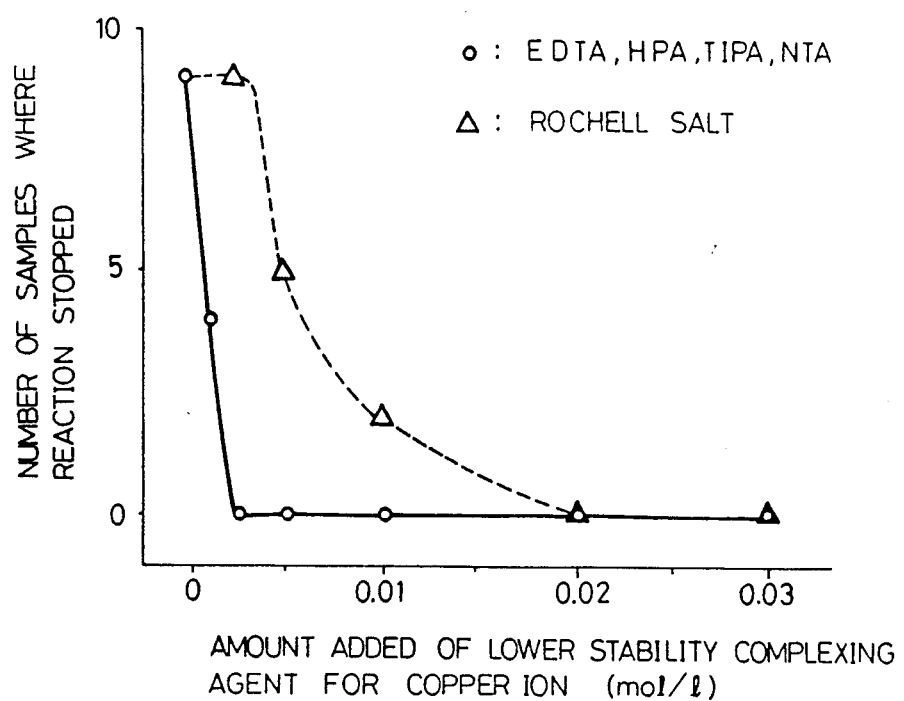
FIG. 2 shows the change of the number of samples where reaction stops, observed when a low stability complexing agent for a copper ion is added to a TEA bath.

The obtained results are shown in FIG. 2. From FIG. 2, it is seen that if EDTA, HPA, TIPA or NTA is added in an amount of at least about 1/100, preferably at least about 1/50 of [$Cu^{2+}$] or if Rochelle salt having a lower stability constant is added in an amount of at least about 1/10 of [$Cu^{2+}$], stopping of the reaction is completely prevented.

Example 2

Figure 3:
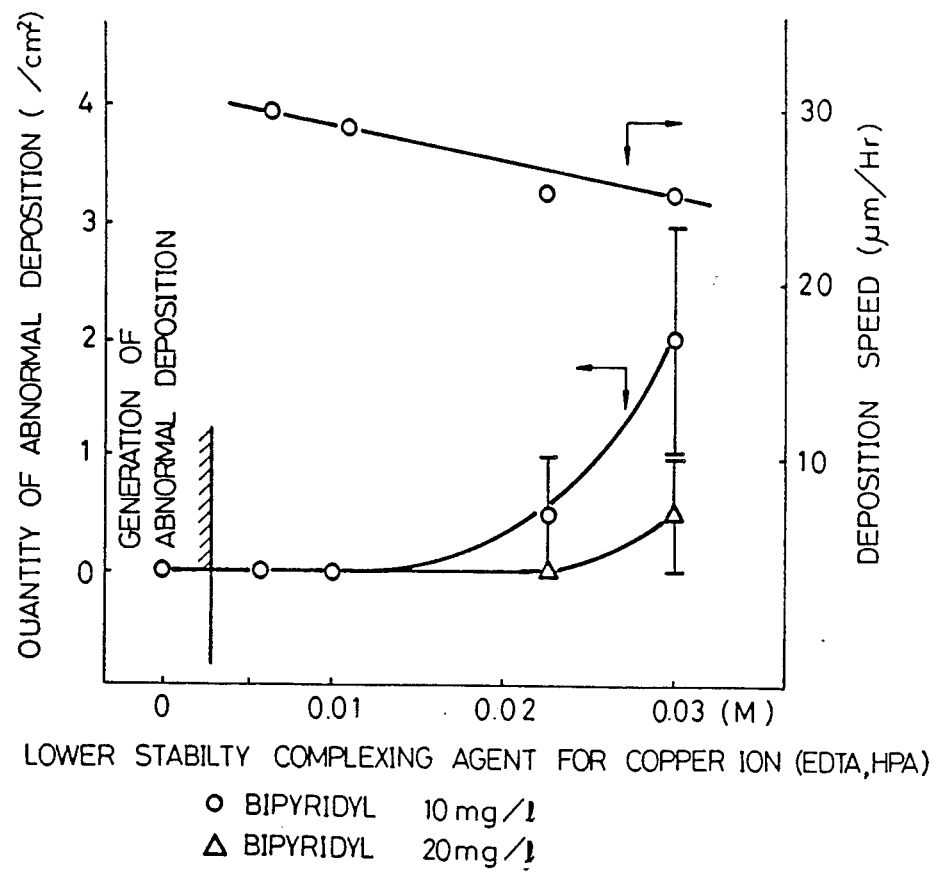
FIG. 3 shows a change of a quantity of abnormal deposition and a deposition speed, observed when a low stability complexing agent for a copper ion is added to a TEA bath.

The same substrate as prepared in Example 1 and a plating bath formed by adding EDTA or HPA as the low stability complexing agent for a copper ion in a predetermined amount to the basic bath used in Example 1 were used, and the deposition speed and the quantity of abnormal deposition on a resist were examined. The obtained results are shown in FIG. 3. The quantity of abnormal deposition was checked by the number of portions of Cu particle deposition per $cm^2$. The measurement was conducted with respect to the case where the amount added to bipyridyl as the stabilizer was 20 mg/l and the case where the amount added of bipyridyl was 10 ml/l. The plating time was 1.5 hours.

The obtained results are shown in FIG. 3. In FIG. 3, no difference was brought about by the kind of the complexing agent for a copper ion, that is, whether the complexing agent was EDTA or HPA.

From FIG. 3, it is seen that reduction of the deposition speed by the use of the low stability complexing agent for a copper ion is very small, use of a large amount of the low stability complexing agent for a copper ion is not practically preferably because the quantity of abnormal deposition increases, but if the amount of the stabilizer (bipyridyl) is increased, the quantity of abnormal deposition is reduced without generation of the passive state.

Comparative Example 1

| Copper salt, CuCl$_2$ | 0.06 mole/l |
| Complexing agent, triethanolamine | 0.3 mole/l |
| Reducing agent, formalin | 10 ml/l |
| Additive, potassium ferrocyanide | 30 ml/l |
| Additive, bipyridyl | 20 ml/l |
| Surface active agent, PEG 20000 (polyethylene glycol) | 1 g/l |
| pH (25° C.) | 12.7 |
| Bath temperature | 60° C. |

The same substrate as described in Example 1 was plated by the above plating bath under the same conditions as described in Example 2.

When plating was conducted for 10 minutes, the reaction stopped in 7 test pieces among 10 test pieces.

Comparative Example 2

| Copper salt, CuCl$_2$ | 0.06 mole/l |
| Complexing agent, triethanolamine | 0.3 mole/l |
| Reducing agent, formalin | 10 ml/l |
| Additive, potassium ferrocyanide | 20 ml/l |
| Additive, bipyridyl | 10 ml/l |
| Surface active agent, PEG 20000 | 1 g/l |
| pH (25° C.) | 12.7 |
| Bath temperature | 60° C. |

The treatment was conducted in the same manner as described in Comparative Example 1 by using the above plating bath where the amounts of the additives were changed. In 30 minutes, the reaction stopped in 4 test pieces among 10 test pieces.

Example 3

The procedures of Comparative Example 2 were repeated in the same manner except that Rochelle salt was added as the low stability complexing agent for a copper ion to the bath of Comparative Example 2. The reaction did not stop. The deposition speed of the copper film was 40 μm/hr.

Example 4

The procedures of Comparative Example 1 were repeated in the same manner except that EDTA, HPA or TIPA was added in an amount of 0.005 mole/l as the low stability complexing agent for a copper ion to the bath of Comparative Example 1. In any case, stopping of the reaction was not caused, and in each case, the copper deposition speed was 25 to 30 μm/hr.

Example 5

The procedures of Comparative Example 1 were repeated in the same manner except that Rochelle salt was added in an amount of 0.02 mole/l as the low stability complexing agent for a copper ion to the bath of Comparative Example 1. Stopping of the reaction was not caused, and the copper deposition speed was 30 μm/hr.

Comparative Example 3

| Copper salt, CuCl$_2$ | 0.04 mole/l |
| Complexing agent for copper ion, EDTA | 0.05 mole/l |
| Reducing agent, formalin | 10 ml/l |
| Additive, potassium ferrocyanide | 30 mg/l |
| Additive, bipyridyl | 20 mg/l |
| Surface active agent, PEG 2000 | 30 mg/l |
| pH (25° C.) | 12.5 |
| Bath temperature | 60° C. |

The procedures of Comparative Example 1 were repeated by using the above plating bath. In 30 minutes, the reaction stopped in 2 test pieces among 10 test pieces.

Example 6

The procedures of Comparative Example 3 were repeated in the same manner except that Rochelle salt was added in an amount of 0.03 mole/l as the complexing agent for a copper ion to the plating solution of Comparative Example 3. Stopping of the reaction was not caused, and the copper deposition speed was 3 μm/hr.

Example 7

To the same bath as described in Referential Example 1, EDTA or HPA was added in an amount of 0.01 mole/l as the low stability complexing agent for a copper ion, and experiments were repeated at various pH values (25° C.).

Figure 4:
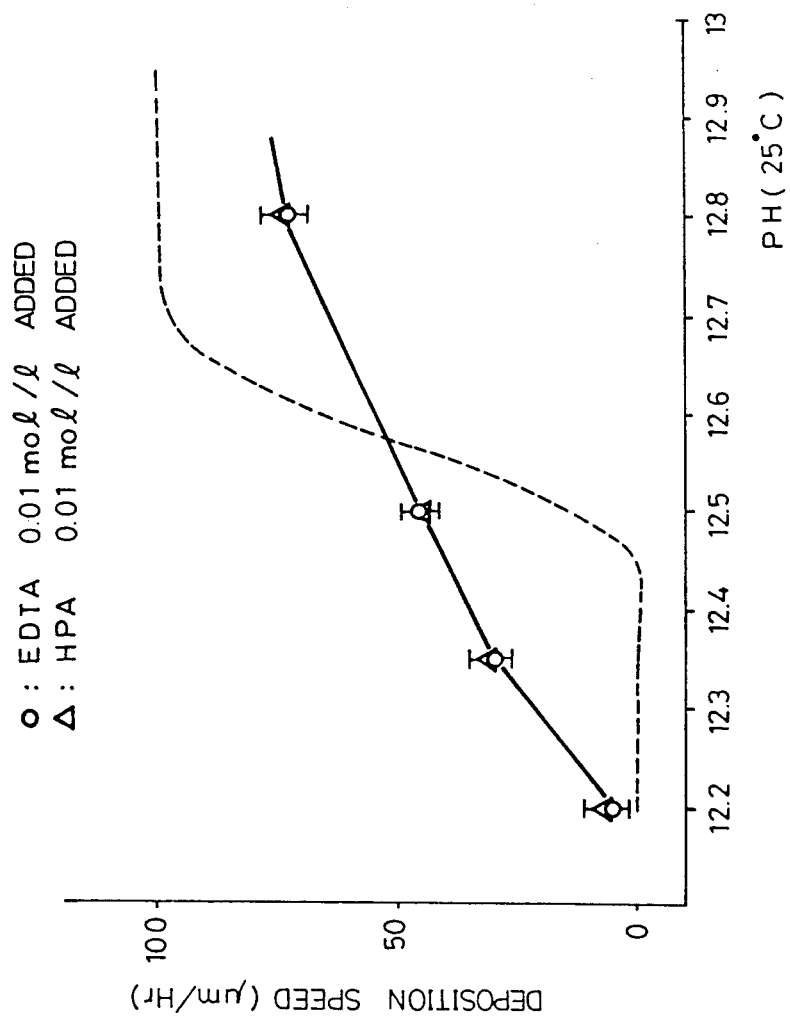
FIG. 4 shows the pH dependency of reaction observed when a lowly stable complexing agent for a copper ion is added.

The obtained results are shown in FIG. 4. When the pH value was higher than 12.2 (25° C.), stopping of the reaction was not caused. For comparison, the change of the deposition speed, observed when only the pH value (25° C.) was changed in the bath of Referential Example 1, is indicated by a broken line in FIG. 4.

From this comparison, it is seen that if the low stability complexing agent for a copper ion is added according to the present invention, high-speed plating can be realized even at a low pH range where the reaction is not caused in the absence of the low stability complexing agent for a copper ion, and therefore, maintenance of the plating bath can be facilitated according to the present invention.

Example 8

A small amount of EDTA was added as the complexing agent for a copper ion to the basic TEA bath of the present invention, and the empirical reactivity with substrates was examined. The obtained results are shown in Table 2.

Example 9

A ceramic substrate metallized with a tungsten paste was alkali-cleaned (OPC250 Cleaner supplied by Okubo Seiyaku) and activated with a 30% solution of hydrochloric acid. Then, the substrate was neutralized with a solution of sodium hydroxide to obtain a material to be plated.

This material to be treated was plated by using the following basic electroless copper plating bath and using EDTA as the low stability complexing agent for a copper ion while changing the amount added of the complexing agent.

| Copper salt, CuCl$_2$ | 0.06 mole/l |
|---|---|
| Complexing agent for copper ion, TEA | 0.30 mole/l |
| Reducing agent, formalin | 16 ml/l |
| pH (25° C.) | 12.7 |
| Temperature | 60° C. |

Figure 5:
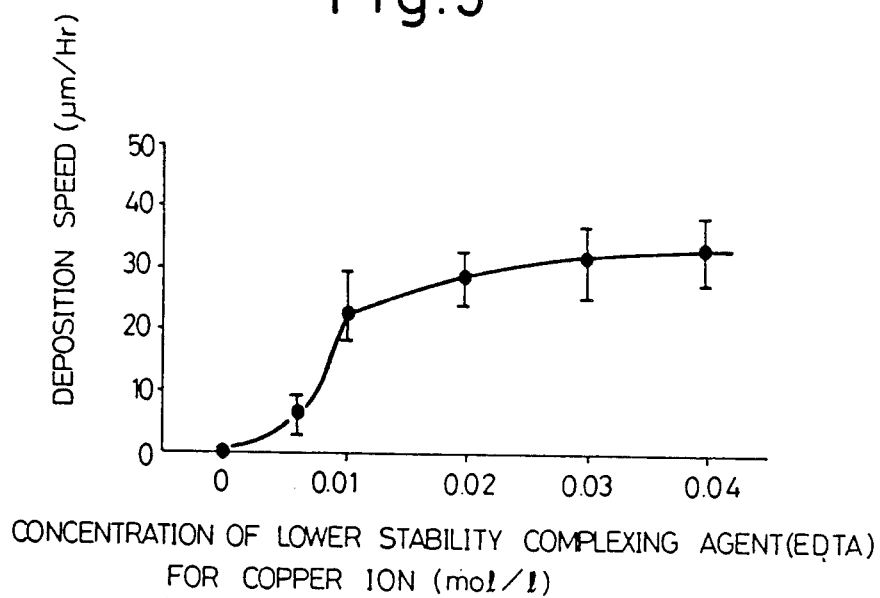
FIG. 5 shows the relation between the amount added of a low stability complexing agent for a copper ion and the deposition speed.

The obtained results are shown in FIG. 5. From FIG. 5, it is seen that although plating is impossible on the tungsten pattern by the basic bath, if a small amount of EDTA is added, a plating reaction takes place even on the tungsten pattern, the copper deposition speed is brought close to the saturation value by a slight increase of the amount added of EDTA, and the speed of the disclosed plating reaction is high.

Comparative Example 4

The substrate used in Example 9 was plated in the same manner as described in Example 9 by using the following EDTA bath, which is typical conventional plating bath.

| Copper salt, CuCl$_2$ | 0.04 mole/l |
|---|---|
| Complexing agent for copper ion, EDTA | 0.06 mole/l |
| Reducing agent, formalin | 16 ml/l |
| pH (25° C.) | 12.7 |
| Temperature | 60° C. |

The plating reaction was smoothly initiated, and the copper deposition speed was 5 μm/hr.

Example 10 and Comparative Example 5

The procedures of Example 9 were repeated in the same manner except that the bath composition and conditions were changed.

The obtained results are shown in Table 3. For comparison, the results obtained in Comparative Example 4 and Referential Example 1 are also shown in Table 3.

TABLE 3

| | Copper Salt CuCl$_2$ (mole/l) | High stability complexing agent TEA (mole/l) | Low stability complexing agent EDTA (mole/l) | Reducing agent Formaldehyde (mole/l) | pH (25° C.) | Film thickness (μm/hr) |
|---|---|---|---|---|---|---|
| Conventional Bath (Comparative Example 4) | 0.04 | — | 0.06 | 0.20 | 12.5 | 5 |
| High-speed Bath* (Referential Example 1) | 0.06 | 0.30 | — | 0.20 | 12.7 | 50 |
| Example 10 | 0.06 | 0.45 | 0.04 | 0.25 | 12.78 | 10 |
| | 0.04 | 0.33 | 0.01 | 0.30 | 12.98 | 20 |
| | 0.06 | 0.20 | 0.04 | 0.20 | 13.00 | 26 |
| | 0.07 | 0.45 | 0.02 | 0.25 | 13.05 | 32 |
| | 0.04 | 0.45 | 0.01 | 0.25 | 13.40 | 25 |
| | 0.06 | 0.33 | 0.04 | 0.30 | 13.25 | 16 |
| | 0.07 | 0.20 | 0.02 | 0.20 | 12.95 | 16 |
| Comparative Example 5 | 0.04 | 0.20 | 0.01 | 0.20 | 11.5 | 0 |
| | 0.07 | 0.33 | 0.02 | 0.30 | 11.70 | 0 |

Note
*A ceramic substrate having a tungsten pattern was used as the substrate.

EXAMPLE 11

A glass-epoxy substrate having an ABS type adhesive coated on both the front and back surfaces thereof was prepared, and the substrate was immersed in a solution of CrO$_3$-H$_2$SO$_4$ to roughen the surfaces of the ABS type adhesive layers. Incidentally, 300 g of CrO$_3$ was contained in 1 l of the solution and 300 cc of H$_2$SO$_4$ was contained 1 l of the solution.

Residual Cr was removed from the substrate surface, and the substrate surface was contacted with a palladium catalyst liquid, Cataposit 44 supplied by Shipley Co., to effect the catalyzing treatment of the substrate surface.

A resist was formed on the so-treated substrate by the printing process or the photographic process.

These treatments are preliminary treatments customarily adopted in the known electroless copper plating process.

Then, the so-treated substrate was plated for 15 minutes in a first electroless copper plating solution having a composition shown below.

| Copper salt, CuSO$_4$ | 0.04 mole/l |
|---|---|
| Complexing agent, Rochelle salt | 0.06 mole/l |
| Reducing agent, 37% formalin | 15 ml/l |
| Surface active agent, polyethylene glycol (molecular weight = 600) | 0.1 g/l |
| pH | 12.3 (25° C.) |
| Temperature of plating solution | 30° C. |

A copper plating layer having a thickness of about 0.5 μm was formed. Then, plating was carried out for 1 hour in a second electroless plating solution having a composition shown below.

| Copper salt, CuSO$_4$ | 0.06 mole/l |
|---|---|
| Complexing agent, triethanolamine | 0.3 mole/l |
| Complexing agent, ethylenediamine tetraacetic acid | 0.01 mole/l |
| Reducing agent, 37% formalin | 18 ml/l |
| Additive, potassium ferrocyanide | 30 ml/l |
| Additive, bipyridyl | 20 mg/l |
| Surface active agent, anionic surface active agent | 1 g/l |
| pH | 12.6 (25° C.) |
| Temperature of plating solution | 60° C. |

Figure 6A:
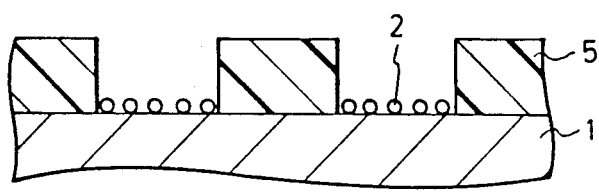
FIGS. 6A through 6D are diagrams illustrating steps of the electroless copper plating process of the present invention.
Figure 6B:
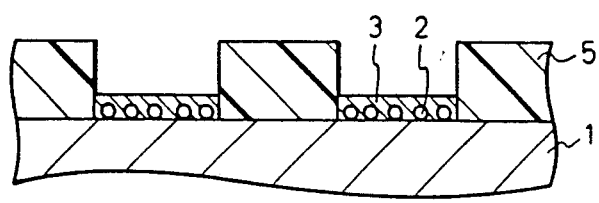
Figure 6C:
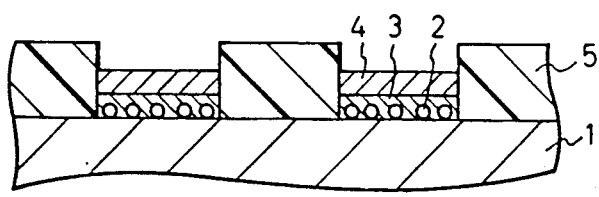
Figure 6D:
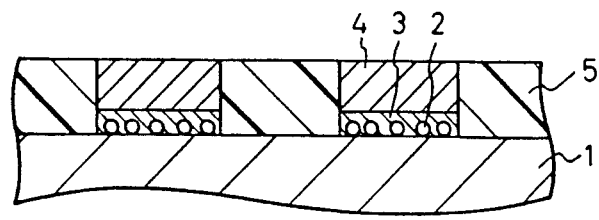

The steps for formation of the plating layer in the present example are diagrammatically illustrated in FIGS. 6A, 6B, 6C and 6D. A layer 2 of palladium particles was first formed on the glass-epoxy substrate 1, and then, a first copper layer 3 was formed on the surface of the substrate 1 in the first electroless copper plating bath (see FIGS. 6A and 6B). Then, a second copper layer 4 was formed on the first copper layer 3 in the second electroless copper plating bath (see FIG. 6C). FIG. 6D illustrates the state where plating was completed. In these figures, reference numeral 5 represents a resist pattern which was used as a mask for a formation of a plating pattern.

The thickness of the so-obtained copper plating layer was examined. The number of tested samples was 10. The obtained results are shown as the mean value and deviation in FIG. 7.

Example 12

Plating was carried out for 10 minutes by using an electroless copper plating bath shown below instead of the first electroless copper plating bath used in Example 1, and then, plating was carried out for 1 hour in the second electroless copper plating bath used in Example 1.

| | | |
|---|---|---|
| Copper salt, $CuSO_4$ | 0.04 | mole/l |
| Complexing agent, ethylenediamine-tetraacetic acid | 0.06 | mole/l |
| Reducing agent, 37% formalin | 15 | ml/l |
| Surface active agent, polyethylene glycol (molecular weight = 600) | 0.1 | g/l |
| pH | 12.5 | (25° C.) |
| Temperature of plating bath | 50° C. | |

With respect to 10 samples, the thickness of the obtained copper layer was examined in the same manner as described in Example 11. The obtained results are shown in FIG. 7.

Example 13 (for purpose of comparison)

For comparison with Examples 11 and 12, plating was carried out for 1 hour in the second electroless plating bath used in Example 11.

The thickness of the obtained copper plating layer was examined. The obtained results are shown in FIG. 7.

As is seen from FIG. 7, there was a great dispersion of the plating thickness in Example 13. The thickness was generally in the range of 40 to 50 μm, but a thickness of about 20 μm was partially observed. In contrast, in Examples 11 and 12, since a substantially uniform layer having a thickness of about 0.5 μm was first formed in the first electroless copper plating bath and plating was then carried out in the second electroless copper plating bath, the dispersion of the plating thickness was very small.

Example 14

A conductor pattern composed of tungsten was formed on a plate-shaped sintered alumina substrate by printing. The substrate was deemed in an aqueous solution of sodium silicate (OPC250 Cleaner supplied by Okuno Seiyaku). Then, the deemed substrate was washed with a 62% aqueous solution of nitric acid and the surface of the substrate was activated by a 35% aqueous solution of hydrochloric acid.

The so-treated substrate was plated for 2 minutes in a first electroless copper plating bath having a composition described below.

| | | |
|---|---|---|
| Copper salt, $CuCl_2$ | 0.06 | mole/l |
| Complexing agent, ethylenediamine-tetraacetic acid | 0.10 | mole/l |
| Reducing agent, 37% formalin | 16 | ml/l |
| Additive, 2,2'-bipyridyl | 20 | mg/l |
| Additive, potassium ferrocyanide | 30 | mg/l |
| pH | 13.0 | (25° C.) |
| Temperature of plating bath | 60° C. | |

Then, plating was carried out for 8 minutes in a second electroless copper plating bath having a composition described below obtain a copper layer having an entire thickness of 3 to 3.5 μm.

| | | |
|---|---|---|
| Copper salt, $CuCl_2$ | 0.06 | mole/l |
| Complexing agent, ethylenediamine-tetraacetic acid | 0.02 | mole/l |
| Complexing agent, triethanolamine | 0.20 | mole/l |
| Reducing agent, 37% formalin | 0.20 | mole/l |
| Additive, 2,2'-bipyridyl | 20 | mg/l |
| Additive, potassium ferrocyanide | 30 | mg/l |
| pH | 12.7 | (25° C.) |
| Temperature of plating bath | 60° C. | |

The solder wettability and bonding strength of the copper layer formed on the surface of the substrate were evaluated.

The solder wettability was evaluated by placing a solder ball having a diameter of 1 mm on the plated copper layer (2 mm×2 mm) while heating the plated substrate at 300° C., and measuring the spread diameter of the solder after a lapse of 30 seconds. Incidentally, the number (n) of samples subjected to the measurement was 8.

The bonding strength was evaluated by soldering a copper wire to the copper layer and measuring the peel strength of the copper wire. The number (n) of samples subjected to the measurement was 16.

Figure 8:
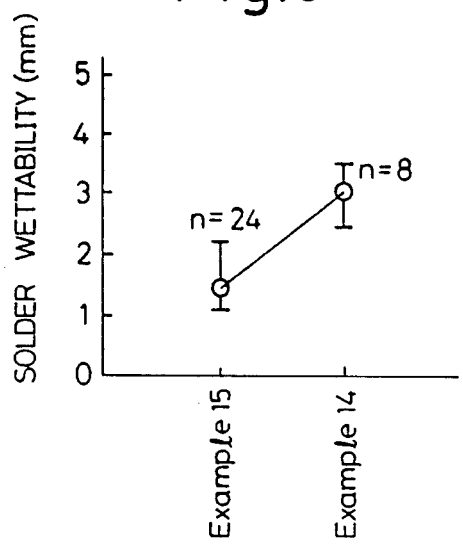
FIGS. 8 and 9 illustrate the solder wettability of the plating layer and the bonding strength in the examples.
Figure 9:
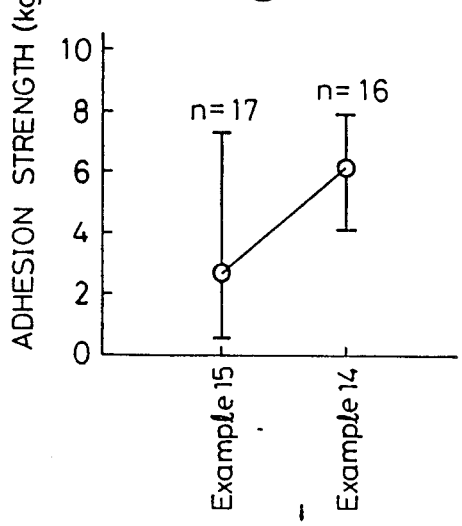

The obtained results are shown in FIGS. 8 and 9.

Example 15 (for purpose of comparison) For comparison with Example 14, plating was carried out for 8 minutes in the second electroless plating bath of Example 14 to obtain a copper layer having an entire thickness of 3 to 3.5 μm.

The solder wettability and bonding strength were examined in the same manner as described in Example 14. The obtained results are shown in FIGS. 8 and 9.

From the results shown in FIGS. 8 and 9, it is seen that the copper plating layer of Example 14 was excellent over the copper plating layer of Example 15 in the solder wettability and bonding strength.

Figure 10:
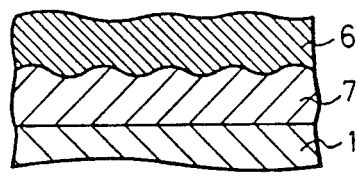
FIGS. 10 and 11 are diagrams showing plating layers formed in Examples 14 and 15.

The reason is that in Example 14, since the conductor pattern was thinly but uniformly covered with metallic copper having a high activity in the first electroless copper plating bath and copper was then thickly coated on the entire surface in the second electroless copper plating bath, a uniform copper layer as shown in FIG. 10 was obtained. Incidentally, in FIG. 10, reference numerals 1, 6 and 7 represent the substrate, the copper layer and the conductor pattern of tungsten, respectively.

Figure 11:
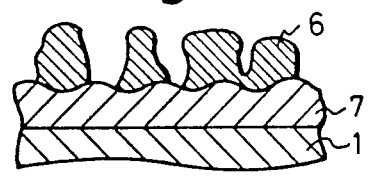

In Example 15, although ethylenediamine-tetraacetic acid was used as the complexing agent, since the amount of this complexing agent was 1/10 of the amount of triethanolamine, the copper layer formed by the ethylenediamine-tetraacetic acid/copper complex was deposited only partially and no uniform layer as deposited. The reactivity of the triethanolamine/copper complex with the copper layer-deposited portion was very high, and a concave-convex copper layer as shown in FIG. 11 was obtained. Accordingly, the copper layer was inferior in the solder wettability and bonding strength.

Example 16

When Rochelle salt, nitrilotriacetic acid or N,N,N',N'-tetrakis(2-hydroxypropyl)ethylenediamine was used as the complexing agent of the first electroless copper plating bath, a copper layer comparable to the copper layer of Example 14 was obtained. This indicates that the catalytic selectivities of these complexing agents for a copper ion are much lower than that of triethanolamine and therefore, copper is deposited on tungsten or molybdenum having a low catalytic activity.

We claim:

1. A process for electrolessly plating copper on a substrate, comprising the steps of i) immersing a substrate having a surface in a first electroless copper plating bath containing a copper ion, a first complexing agent for the copper ion, a reducing agent and a pH-adjusting agent to form a first copper film on the surface of the substrate; and ii) immersing the substrate in a second electroless copper plating bath containing a copper ion, a second complexing agent for the copper ion, a reducing agent and a pH-adjusting agent to form a second copper film on the first copper film; wherein the first complexing agent for the copper ion has a copper complex stability constant substantially lower than that of the second complexing agent for the copper ion.

2. A process according to claim 1, wherein the complexing agent for the copper ion is at least one member selected from the group consisting of ethylenediamine-tetraacetic acid, N,N,N',N'-tetrakis(2-hydroxypropyl)ethylenediamine, nitrilotriacetic acid and Rochelle salt.

3. A process according to claim 2, wherein the second complexing agent for the copper ion is a trialkanolamine.

4. A process according to claim 1, wherein the trialkanolamine is at least one member selected from the group consisting of triethanolamine and triisopropanolamine.

5. A process according to claim 1, wherein the first complexing agent for the copper ion is Rochelle salt and the second complexing agent for the copper ion is triethanolamine.

6. A process according to claim 1, wherein the first complexing agent for the copper ion is ethylenediaminetetraacetic acid and the second complexing agent for the copper ion is triethanolamine.

7. A process according to claim 1, wherein the second electroless copper plating bath further contains a third complexing agent for the copper ion and the third complexing agent for the copper ion has a copper complex stability constant substantially lower than that of the second complexing agent for the copper ion.

8. A process according to claim 7, wherein the second complexing agent for the copper ion is present in an amount sufficient to substantially complex the copper ion in the second electroless copper plating bath and the third complexing agent for the copper ion is present in an amount of 1/100 to 1/2 equivalent to the copper ion in the second electroless copper plating bath.

9. A process according to claim 8, wherein the second complexing agent for the copper ion is a trialkanolamine and is present in an amount of at least 1.2 equivalents to the copper ion.

10. A process according to claim 9, wherein the second complexing agent for the copper ion is triethanolamine and is present in an amount of 1.3 to 20 equivalents to the copper ion.

11. A process according to claim 9, wherein the third complexing agent for the copper ion is at least one member selected from the group consisting of ethylenediamine-tetraacetic acid, N,N,N',N'-tetrakis(2-hydroxypropyl)ethylenediamine, nitrilotriacetic acid and Rochelle salt.

12. A process according to claim 1, wherein the substrate has a layer of palladium particles formed in advance on the surface thereof.

13. A process according to claim 1, wherein the substrate has a layer of a metal selected from the group consisting of a molybdenum and tungsten formed in advance on the surface thereof.

14. An electroless copper plating process, which comprises forming a copper plating film on the surface of a substrate by immersing the substrate in an electroless copper plating bath containing a copper ion, a complexing agent for the copper ion, a reducing agent and a pH-adjusting agent, wherein the complexing agent for the copper ion comprises a first complexing agent for the copper ion and a second complexing agent for the copper ion, the second complexing agent for the copper ion is present in an amount sufficient to substantially complex the copper ion present in the bath, the copper complex stability constant of the first complexing agent for the copper ion is substantially lower than that of the second complexing agent for the copper ion, and the first complexing agent for the copper ion is present in an amount of 1/100 to ½ equivalent to the copper ion.

15. A process according to claim 14, wherein the substrate has a layer of palladium particles formed in advance on the surface thereof.

16. A process according to claim 14, wherein the substate has a layer of a metal selected from the group consisting of molybdenum and tungsten formed in advance on the surface thereof.

17. A process according to claim 14, wherein the second complexing agent for the copper ion is a trialkanolamine and is present in an amount of at least 1.2 equivalents to the copper ion.

* * * * *